US007406757B2

(12) United States Patent
Mita

(10) Patent No.: US 7,406,757 B2
(45) Date of Patent: Aug. 5, 2008

(54) METHOD OF MANUFACTURING LIQUID EJECTION HEAD

(75) Inventor: Tsuyoshi Mita, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 177 days.

(21) Appl. No.: 11/363,407

(22) Filed: Feb. 28, 2006

(65) Prior Publication Data

US 2006/0196025 A1 Sep. 7, 2006

(30) Foreign Application Priority Data

Mar. 1, 2005 (JP) ............................ 2005-056449

(51) Int. Cl.
*H01L 41/22* (2006.01)
*H04R 17/00* (2006.01)

(52) U.S. Cl. .................... 29/25.35; 29/25.42; 29/25.41; 310/311; 310/328; 310/329; 310/330

(58) Field of Classification Search ....................... None
See application file for complete search history.

(56) References Cited

U.S. PATENT DOCUMENTS 5,933,167 A * 8/1999 Shimada et al. ............... 347/70
6,340,818 B1 * 1/2002 Izumi et al. ............ 250/370.13
2002/0071008 A1 * 6/2002 Hashizume et al. ........... 347/70
2006/0066176 A1 * 3/2006 Nanataki et al. ............ 310/311

FOREIGN PATENT DOCUMENTS

JP 11-207970 A 3/1999
JP 02000103067 A * 4/2000
JP 2003-69106 A 3/2003

* cited by examiner

*Primary Examiner*—Duy-Vu N Deo
(74) *Attorney, Agent, or Firm*—Birch, Stewart, Kolasch & Birch, LLP

(57) ABSTRACT

The method manufactures a liquid ejection head comprising: a plurality of nozzles which eject liquid; a plurality of pressure chambers which are connected to the nozzles, respectively; a diaphragm which forms wall faces of the pressure chambers; and piezoelectric elements which are disposed on the diaphragm at positions corresponding to the pressure chambers and each are formed of at least a piezoelectric material and electrodes overlapping each other. The method comprises the steps of: forming a lower electrode on a whole surface of a substrate that is to form the diaphragm; then forming piezoelectric material by screen printing onto a whole surface of the lower electrode; then forming an upper electrode on a whole surface of the piezoelectric material; then forming a mask having a prescribed pattern on the upper electrode; then dividing the piezoelectric material and the upper electrode by performing a sandblasting process through the mask; and then calcining the substrate together with the divided piezoelectric material and upper electrode.

4 Claims, 5 Drawing Sheets

72
80(70)

74
72
80(70)

76
74
72
80(70)

82
76
74
72
80(70)

82
76
74
72
80(70)

76
74
72
78
80(70)

METHOD OF MANUFACTURING LIQUID EJECTION HEAD

BACKGROUND OF THE INVENTION

1. Field of the Invention

The present invention relates to a method of manufacturing a liquid ejection head, and more particularly, to a method of manufacturing a piezoelectric type liquid ejection head.

2. Description of the Related Art

An image forming apparatus, such as an inkjet printer, is known which comprises a piezoelectric type print head (liquid ejection head) that ejects ink droplets from nozzles by applying pressure to ink accommodated in pressure chambers, through changing the volume of the pressure chambers by means of the displacement of piezoelectric elements.

In recent years, there have been demands for improved image quality in the images formed by image forming apparatuses of this kind. For this purpose, it is necessary further to reduce the size of the ink droplets ejected from the nozzles of the print head, and to increase the density of the nozzles (to achieve high integration), and consequently, the surface area (size) of each pressure chamber must be reduced. Moreover, in the print head based on the piezoelectric system in particular, it is necessary to form the piezoelectric bodies that constitute the piezoelectric elements as very thin films in order to obtain a desired displacement volume in small-sized pressure chambers.

There are known methods of forming piezoelectric bodies including a method using bulk material and a method using screen printing. In the method using bulk material, it is necessary to polish the bulk material in order to form the piezoelectric bodies as thin films; however, there are restrictions on handling and it is then difficult to form the bodies to a thickness of 30 μm or below. On the other hand, in the method using screen printing, it is possible to form the piezoelectric bodies to a thin dimension; however, if it is attempted to print piezoelectric bodies onto positions corresponding to pressure chambers, through a screen, then there is a problem in that processing of the film thickness of a plurality of piezoelectric bodies is difficult, due to droop of the edge portions, and the like.

Japanese Patent Application Publication No. 2003-69106 discloses a method in which lower electrodes are formed by means of screen printing, or the like, on a substrate at positions corresponding to pressure chambers on the substrate, a piezoelectric body (piezoelectric film) is then formed on the whole surface of the substrate in such a manner that the piezoelectric body covers the lower electrodes, a mask is then formed on the piezoelectric body by means of photolithography, the portions of the piezoelectric body not covered by the mask are then removed by means of sandblasting, individual piezoelectric bodies are thereby created, the structure is then calcined, and upper electrodes are then formed by means of screen printing, or the like, on the individual piezoelectric bodies.

Japanese Patent Application Publication No. 11-207970 discloses a method in which, lower electrodes, piezoelectric bodies and upper electrodes are formed in positions corresponding to pressure chambers on a substrate by a method similar to that disclosed in Japanese Patent Application Publication No. 2003-69106, the upper electrodes are then further divided into a plurality of electrodes by means of sandblasting, or the like, in such a manner that a plurality of pressurization devices are provided for each pressure chamber.

In Japanese Patent Application Publication Nos. 2003-69106 and 11-207970, however, the lower electrodes and the upper electrodes are formed individually by screen printing, or the like, at the positions on the substrate corresponding to the pressure chambers, whereas the piezoelectric body is first formed over the whole surface of the substrate and is then divided into individual piezoelectric bodies at the positions on the substrate corresponding to the pressure chambers, by means of photolithography and sandblasting. In other words, the lower and upper electrodes and the piezoelectric bodies are formed by different methods at the positions on the substrate corresponding to the pressure chambers, and hence the manufacturing process of the piezoelectric elements is complicated. Moreover, positional divergence between the lower electrodes, the piezoelectric bodies and the upper electrodes is liable to occur, and hence there is a risk of variations in the ejection performance, such as the volume and speed of flight, of the ink droplets ejected from the nozzles.

Furthermore, when the portions of the piezoelectric body not covered by the mask are removed by a sandblasting process, then the substrate on which the piezoelectric body is to be formed becomes the blast stopping surface, which receives and stops the blasted abrasive particles, and there is a risk that the substrate may be damaged and degraded by the abrasive particles.

SUMMARY OF THE INVENTION

The present invention has been contrived in view of the foregoing circumstances, an object thereof being to provide a method of manufacturing a liquid ejection head comprising piezoelectric elements having good dimensional accuracy, by means of a simple manufacturing process.

In order to attain the aforementioned object, the present invention is directed to a method of manufacturing a liquid ejection head comprising: a plurality of nozzles which eject liquid; a plurality of pressure chambers which are connected to the nozzles, respectively; a diaphragm which forms wall faces of the pressure chambers; and piezoelectric elements which are disposed on the diaphragm at positions corresponding to the pressure chambers and each are formed of at least a piezoelectric material and electrodes overlapping each other, the method comprising the steps of: forming a lower electrode on a whole surface of a substrate that is to form the diaphragm; then forming piezoelectric material by screen printing onto a whole surface of the lower electrode; then forming an upper electrode on a whole surface of the piezoelectric material; then forming a mask having a prescribed pattern on the upper electrode; then dividing the piezoelectric material and the upper electrode by performing a sandblasting process through the mask; and then calcining the substrate together with the divided piezoelectric material and upper electrode.

According to the present invention, since the lower electrode, the undivided piezoelectric material and the undivided upper electrode are formed onto the whole surface of the substrate that is to form the diaphragm, and sandblasting is then performed through the mask having a prescribed pattern in order to simultaneously divide the piezoelectric material and the upper electrode, then the manufacturing process is simplified compared to a case where piezoelectric bodies and electrodes are formed individually by different methods at positions corresponding to the pressure chambers on the substrate, and furthermore, there is little variation or irregularity in the thickness due to divergence in the positions of the piezoelectric material and the upper electrodes, and hence the liquid ejection head having the piezoelectric elements with good dimensional accuracy can be manufactured. Furthermore, since the piezoelectric material and upper electrode are divided before calcining, the effects of thermal contraction in the piezoelectric material are distributed and warping of the substrate is reduced compared to a case where the members are divided after calcining.

Preferably, a hardness of the lower electrode is higher than a hardness of the upper electrode. According to this, by making the lower electrode of a material of the hardness higher than the hardness of a material of the upper electrode, then the lower electrode formed on the whole surface of the substrate, which is to be the diaphragm, can act as the blast stopping layer in the sandblasting process, and therefore it is possible to prevent deterioration of the diaphragm in the sandblasting process.

Preferably, a material of the lower electrode is one of stainless steel, tungsten, cobalt, titanium, Fe—Ni alloy, and Fe—Ni—Cr alloy. As the material of the lower electrode, stainless steel, tungsten, cobalt, titanium, Fe—Ni alloy and Fe—Ni—Cr alloy are suitable as the blast stopping layer in the sandblasting process.

Preferably, the divided piezoelectric material and upper electrode have a substantially square planar shape and are arranged two-dimensionally. According to this, the piezoelectric material contracts in a substantially isotropic fashion during calcining, and therefore warping of the diaphragm is reduced further.

According to the present invention, since a lower electrode, a piezoelectric material and an upper electrode are formed onto the whole surface of a substrate that is to form a diaphragm, and sandblasting is then performed through a mask having a prescribed pattern in order to simultaneously divide the piezoelectric material and the upper electrode, then the manufacturing process is simplified compared to a case where piezoelectric bodies and electrodes are formed individually by different methods at positions corresponding to the pressure chambers on the substrate, and furthermore, there is little variation or irregularity in the thickness due to divergence in the positions of the piezoelectric material and the upper electrodes, and hence a liquid ejection head having piezoelectric elements with good dimensional accuracy can be manufactured. Furthermore, since the piezoelectric material and the upper electrode are divided before calcining, the effects of thermal contraction in the piezoelectric material are distributed and warping of the substrate is reduced compared to a case where the members are divided after calcining.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

General Composition of Inkjet Recording Apparatus

Figure 1:
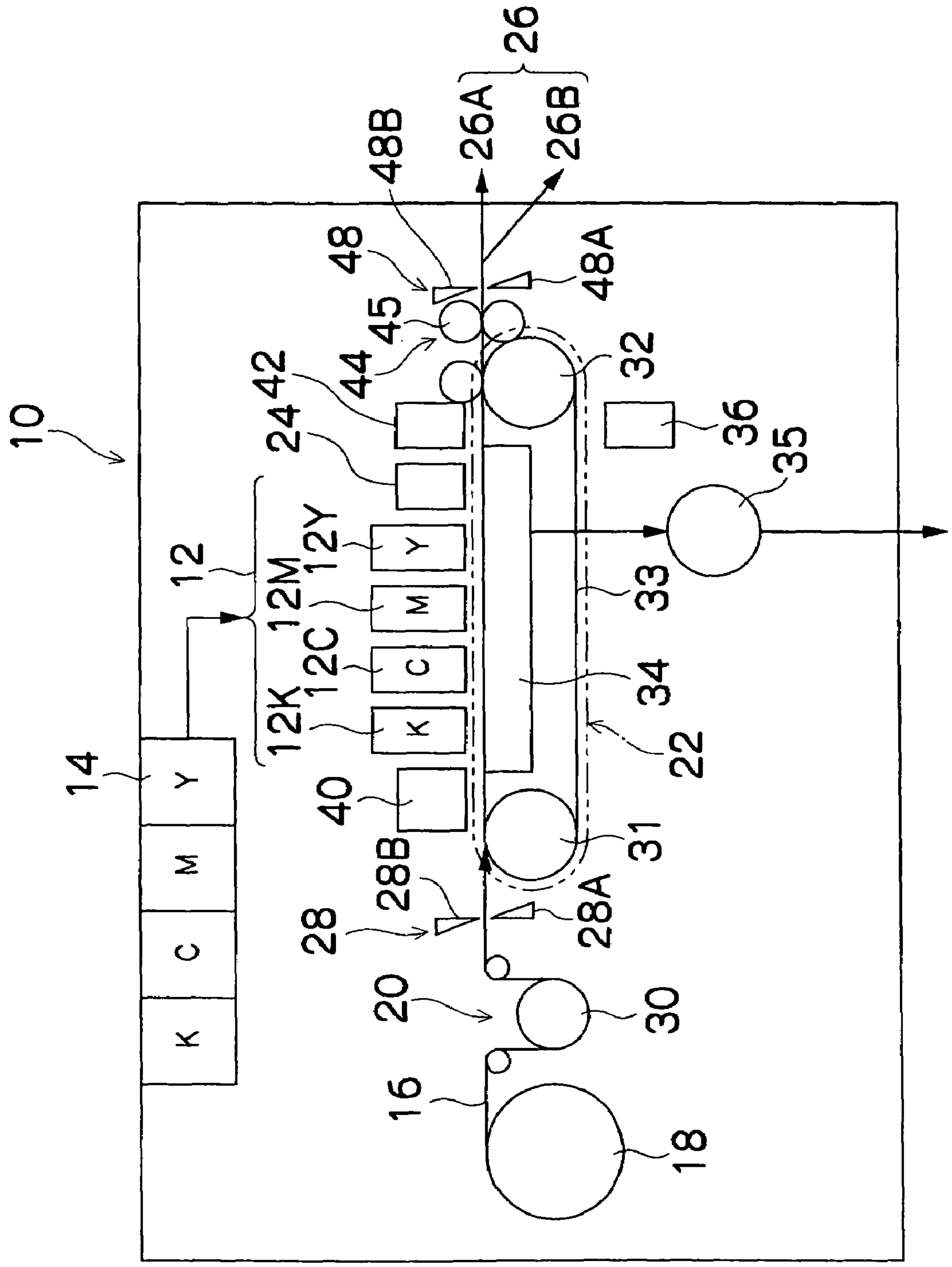
FIG. 1 is a general schematic drawing of an inkjet recording apparatus.

FIG. 1 is a general schematic drawing of an inkjet recording apparatus forming one embodiment of an image forming apparatus according to the present invention. As shown in FIG. 1, the inkjet recording apparatus 10 comprises: a printing unit 12 having a plurality of print heads 12K, 12C, 12M, and 12Y for ink colors of black (K), cyan (C), magenta (M), and yellow (Y), respectively; an ink storing and loading unit 14 for storing inks of K, C, M and Y to be supplied to the print heads 12K, 12C, 12M, and 12Y; a paper supply unit 18 for supplying recording paper 16; a decurling unit 20 for removing curl in the recording paper 16; a suction belt conveyance unit 22 disposed facing the nozzle face (ink-droplet ejection face) of the print unit 12, for conveying the recording paper 16 while keeping the recording paper 16 flat; a print determination unit 24 for reading the printed result produced by the printing unit 12; and a paper output unit 26 for outputting image-printed recording paper (printed matter) to the exterior.

In FIG. 1, a magazine for rolled paper (continuous paper) is shown as an example of the paper supply unit 18; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which roll paper is used, a cutter 28 is provided as shown in FIG. 1, and the roll paper is cut to a desired size by the cutter 28. The cutter 28 has a stationary blade 28A, whose length is not less than the width of the conveyor pathway of the recording paper 16, and a round blade 28B, which moves along the stationary blade 28A. The stationary blade 28A is disposed on the reverse side of the printed surface of the recording paper 16, and the round blade 28B is disposed on the printed surface side across the conveyance path. When cut paper is used, the cutter 28 is not required.

In the case of a configuration in which a plurality of types of recording paper can be used, it is preferable that an information recording medium such as a bar code and a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 16 delivered from the paper supply unit 18 retains curl due to having been loaded in the magazine. In order to remove the curl, heat is applied to the recording paper 16 in the decurling unit 20 by a heating drum 30 in the direction opposite from the curl direction in the magazine. The heating temperature at this time is preferably controlled so that the recording paper 16 has a curl in which the surface on which the print is to be made is slightly round outward.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle face of the printing unit 12 and the sensor face of the print determination unit 24 forms a plane (flat plane).

The belt 33 has a width that is greater than the width of the recording paper 16, and a plurality of suction apertures (not shown) are formed on the belt surface. A suction chamber 34 is disposed in a position facing the sensor surface of the print determination unit 24 and the nozzle surface of the printing unit 12 on the interior side of the belt 33, which is set around the rollers 31 and 32, as shown in FIG. 1; and a negative pressure is generated by sucking air from the suction chamber 34 by means of a fan 35, thereby the recording paper 16 on the belt 33 is held by suction.

The belt 33 is driven in the clockwise direction in FIG. 1 by the motive force of a motor (not shown) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt-cleaning unit 36 is disposed in a predetermined position (a suitable position outside the printing area) on the exterior side of the belt 33. Although the details of the configuration of the belt-cleaning unit 36 are not shown, examples thereof include a configuration in which the belt 33 is nipped with cleaning rollers such as a brush roller and a water absorbent roller, an air blow configuration in which clean air is blown onto the belt 33, or a combination of these. In the case of the configuration in which the belt 33 is nipped with the cleaning rollers, it is preferable to make the line velocity of the cleaning rollers different than that of the belt 33 to improve the cleaning effect.

The inkjet recording apparatus 10 can comprise a roller nip conveyance mechanism, in which the recording paper 16 is pinched and conveyed with nip rollers, instead of the suction belt conveyance unit 22. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 40 is disposed on the upstream side of the printing unit 12 in the conveyance pathway formed by the suction belt conveyance unit 22. The heating fan 40 blows heated air onto the recording paper 16 to heat the recording paper 16 immediately before printing so that the ink deposited on the recording paper 16 dries more easily.

The print unit 12 is a so-called "full line head" in which a line head having a length corresponding to the maximum paper width is arranged in a direction (main scanning direction) that is perpendicular to the paper conveyance direction (sub-scanning direction).

More specifically, the print heads 12K, 12C, 12M and 12Y forming the print unit 12 are constituted by line heads in which a plurality of ink ejection ports (nozzles) are arranged through a length exceeding at least one edge of the maximum size recording paper 16 intended for use with the inkjet recording apparatus 10.

The print heads 12K, 12C, 12M, and 12Y are arranged in the order of black (K), cyan (C), magenta (M), and yellow (Y) from the upstream side (left side in FIG. 1), along the conveyance direction of the recording paper 16 (paper conveyance direction). A color image can be formed on the recording paper 16 by ejecting the inks from the print heads 12K, 12C, 12M, and 12Y, respectively, onto the recording paper 16 while conveying the recording paper 16.

The print unit 12, in which the full-line heads covering the entire width of the paper are thus provided for the respective ink colors, can record an image over the entire surface of the recording paper 16 by performing the action of moving the recording paper 16 and the print unit 12 relative to each other in the paper conveyance direction (sub-scanning direction) just once (in other words, by means of a single sub-scan). Higher-speed printing is thereby made possible and productivity can be improved in comparison with a shuttle type head configuration in which a print head moves reciprocally in the direction (main scanning direction) which is perpendicular to the paper conveyance direction.

Here, the terms main scanning direction and sub-scanning direction are used in the following senses. More specifically, in a full-line head comprising rows of nozzles that have a length corresponding to the entire width of the recording paper, "main scanning" is defined as printing one line (a line formed of a row of dots, or a line formed of a plurality of rows of dots) in the breadthways direction of the recording paper (the direction perpendicular to the conveyance direction of the recording paper) by driving the nozzles in one of the following ways: (1) simultaneously driving all the nozzles; (2) sequentially driving the nozzles from one side toward the other; and (3) dividing the nozzles into blocks and sequentially driving the blocks of the nozzles from one side toward the other. The direction indicated by one line recorded by a main scanning action (the lengthwise direction of the band-shaped region thus recorded) is called the "main scanning direction".

On the other hand, "sub-scanning" is defined as to repeatedly perform printing of one line (a line formed of a row of dots, or a line formed of a plurality of rows of dots) formed by the main scanning, while moving the full-line head and the recording paper relatively to each other. The direction in which sub-scanning is performed is called the sub-scanning direction. Consequently, the conveyance direction of the reference point is the sub-scanning direction and the direction perpendicular to same is called the main scanning direction.

Although a configuration with the KCMY four standard colors is described in the present embodiment, the combinations of the ink colors and the number of colors are not limited to these, and light and/or dark inks can be added as required. For example, a configuration is possible in which print heads for ejecting light-colored inks such as light cyan and light magenta are added.

As shown in FIG. 1, the ink storing and loading unit 14 has ink tanks for storing the inks of the colors corresponding to the respective print heads 12K, 12C, 12M, and 12Y, and the respective tanks are connected to the print heads 12K, 12C, 12M, and 12Y by means of channels (not shown). The ink storing and loading unit 14 has a warning device (for example, a display device, an alarm sound generator, or the like) for warning when the remaining amount of any ink is low, and has a mechanism for preventing loading errors among the colors.

The print determination unit 24 has an image sensor (line sensor) for capturing an image of the ink-droplet deposition result of the printing unit 12, and functions as a device to check for ejection defects such as clogs of the nozzles in the printing unit 12 from the ink-droplet deposition results evaluated by the image sensor.

The print determination unit 24 of the present embodiment is configured with at least a line sensor having rows of photoelectric transducing elements with a width that is greater than the ink-droplet ejection width (image recording width) of the print heads 12K, 12C, 12M, and 12Y. This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements which are arranged two-dimensionally.

The print determination unit 24 reads a test pattern image printed by the print heads 12K, 12C, 12M, and 12Y for the respective colors, and the ejection of each head is determined. The ejection determination includes the presence of the ejection, measurement of the dot size, and measurement of the dot deposition position.

A post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substance that cause dye molecules to break down, and has the effect of increasing the durability of the print.

A heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and the uneven shape is transferred to the image surface.

The printed matter generated in this manner is outputted from the paper output unit 26. The target print (i.e., the result of printing the target image) and the test print are preferably outputted separately. In the inkjet recording apparatus 10, a sorting device (not shown) is provided for switching the outputting pathways in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48. The cutter 48 is disposed directly in front of the paper output unit 26, and is used for cutting the test print portion from the target print portion when a test print has been performed in the blank portion of the target print. The structure of the cutter 48 is the same as the first cutter 28 described above, and has a stationary blade 48A and a round blade 48B.

Although not shown, the paper output unit 26A for the target prints is provided with a sorter for collecting prints according to print orders.

Structure of Print Head

Next, the structure of a print head will be described. The print heads 12K, 12C, 12M and 12Y of the respective ink colors have the same structure, and a reference numeral 50 is hereinafter designated to any of the print heads.

Figure 2:
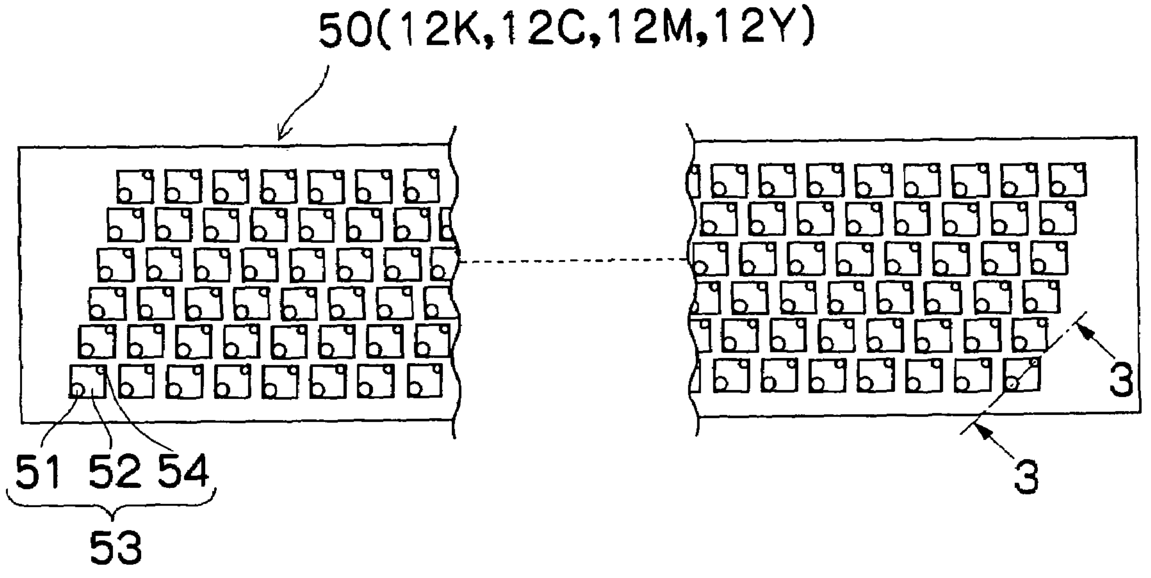
FIG. 2 is a plan perspective diagram showing an example of the structure of a print head.

FIG. 2 is a plan view perspective diagram showing the example of the structure of a print head 50. In FIG. 2, in order to facilitate understanding of the planar arrangement of the nozzles 51, pressure chambers 52 and ink supply ports 54, only the arrangement of these elements is depicted.

As shown in FIG. 2, the print head 50 according to the present embodiment has a structure in which a plurality of ink chamber units 53, each having a nozzle 51 ejecting ink droplets, a pressure chamber 52 corresponding to the nozzle 51, and the like, are two-dimensionally disposed in the form of a staggered matrix, and hence the effective nozzle interval (the projected nozzle pitch) as projected in the lengthwise direction of the print head 50 (the direction perpendicular to the paper conveyance direction) is reduced (high nozzle density is achieved).

The pressure chamber 52 provided corresponding to each of the nozzles 51 is approximately square-shaped in plan view, and has the nozzle 51 and the ink supply port 54 arranged in both corners on a diagonal line of the square.

Figure 3:
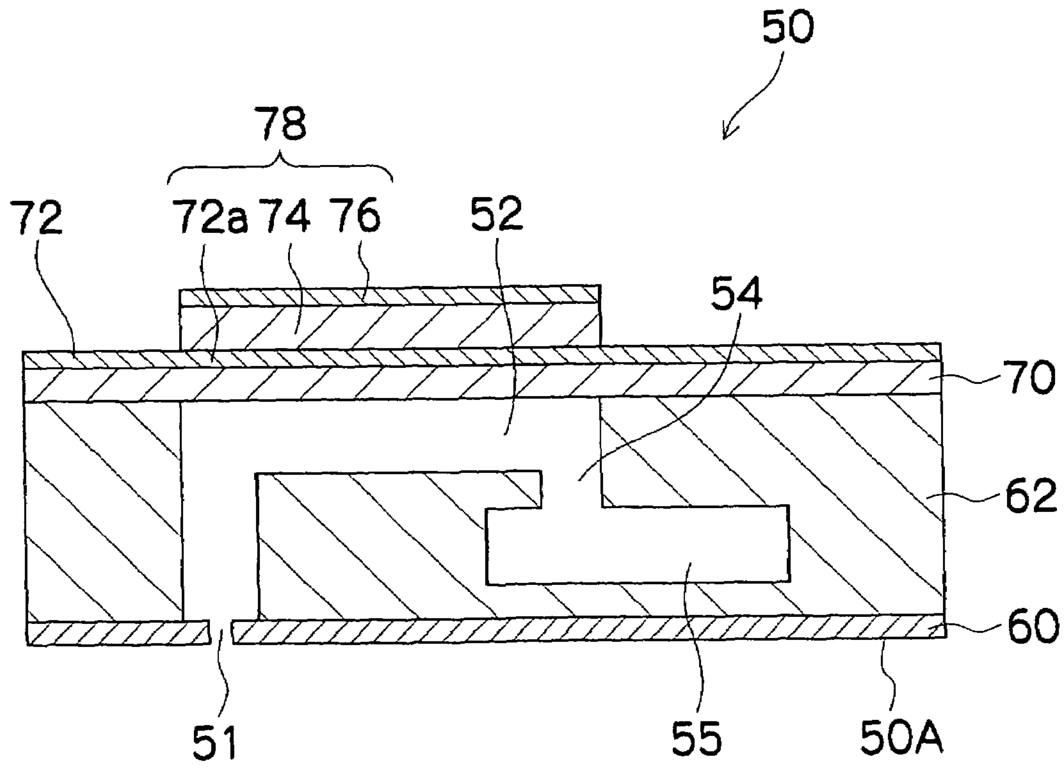
FIG. 3 is a cross-sectional diagram along line 3-3 in FIG. 2.

FIG. 3 is a cross-sectional diagram along line 3-3 in FIG. 2. As shown in FIG. 3, the print head 50 according to the present embodiment has a structure constructed from a plurality of plate members. More specifically, a nozzle plate 60 in which the nozzles 51 are formed is disposed at the nozzle surface (ink ejection surface) side 50A, and a flow channel plate 62 formed selectively with the pressure chambers 52 and the ink flow channels, such as the ink supply ports 54, and a diaphragm plate 70 which constitutes the upper walls of the pressure chambers 52, are formed on the upper surface of the nozzle plate 60 in FIG. 3.

Each pressure chamber 52 is connected to the nozzle 51 at one end thereof, and is connected to a common liquid chamber 55 at the other end thereof through the ink supply port 54. The common liquid chamber 55 is connected to an ink tank (not shown) which forms an ink supply source, and it stores ink supplied from the ink tank through a supply port (not shown).

A common electrode 72 (lower electrode) is formed on the whole upper surface of the diaphragm 70 (the whole area of the surface of the diaphragm 70 reverse to the surface adjacent to the pressure chambers 52). Piezoelectric bodies (piezoelectric material) 74 and individual electrodes (upper electrodes) 76 are formed to overlap each other on the common electrode 72 at positions facing the pressure chambers 52 across the common electrode 72. The piezoelectric bodies 74, which are thus provided corresponding to the pressure chambers 52, and the common electrode 72*a* and the individual electrodes 76, which are arranged to face the common electrode 72*a* across the piezoelectric bodies 74, constitute piezoelectric elements 78 forming pressurization devices for pressurizing the ink accommodated inside the pressure chambers 52.

Figure 4:
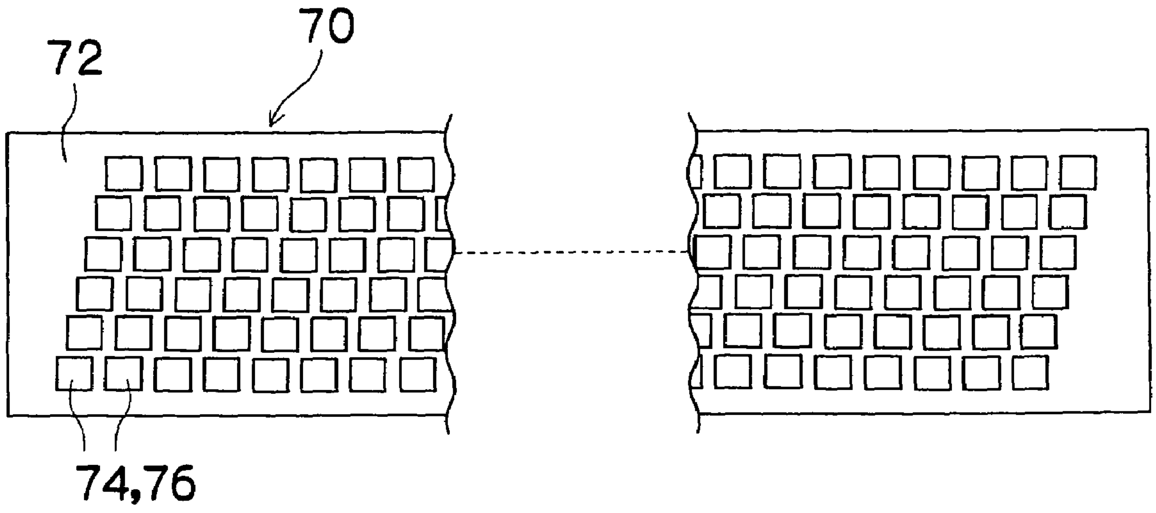
FIG. 4 is a plan diagram showing the positional relationship between piezoelectric bodies and individual electrodes on a diaphragm.

FIG. 4 is a plan diagram showing the positions of the piezoelectric bodies 74 and the individual electrodes 76 on the diaphragm 70. As shown in FIG. 4, the piezoelectric bodies 74 and the individual electrodes 76 have a substantially square planar shape, similarly to the pressure chambers 52 shown in FIG. 2, and they are disposed (two-dimensionally) in a staggered matrix fashion on the diaphragm 70 through the common electrode 72 formed over the whole surface of the diaphragm 70.

Next, the action of the print head 50 will be described with reference to FIG. 3. In ink ejecting operation, when a voltage is applied from a drive circuit (not shown) to the individual electrode 76 of the piezoelectric element 78 and the common electrode 72, then the piezoelectric body 74 deforms due to a lateral piezoelectric effect, and the portion of the diaphragm 70 corresponding to the piezoelectric body 74 is bent toward the pressure chamber 52. Consequently, the volume of the pressure chamber 52 is reduced, the ink accommodated inside the pressure chamber 52 is pressurized, and an ink droplet is ejected from the nozzle 51 connected to the pressure chamber 52. After ejecting ink, when the voltage applied to the piezoelectric element 78 returns to its original value, the piezoelectric body 74 and the diaphragm 70 return to their original state, and ink is supplied to the pressure chamber 52 from the common liquid chamber 55 through the ink supply port 54.

Method of Manufacturing Print Head

Figures 5A, 5B, 5C, 5D, 5E, 5F:
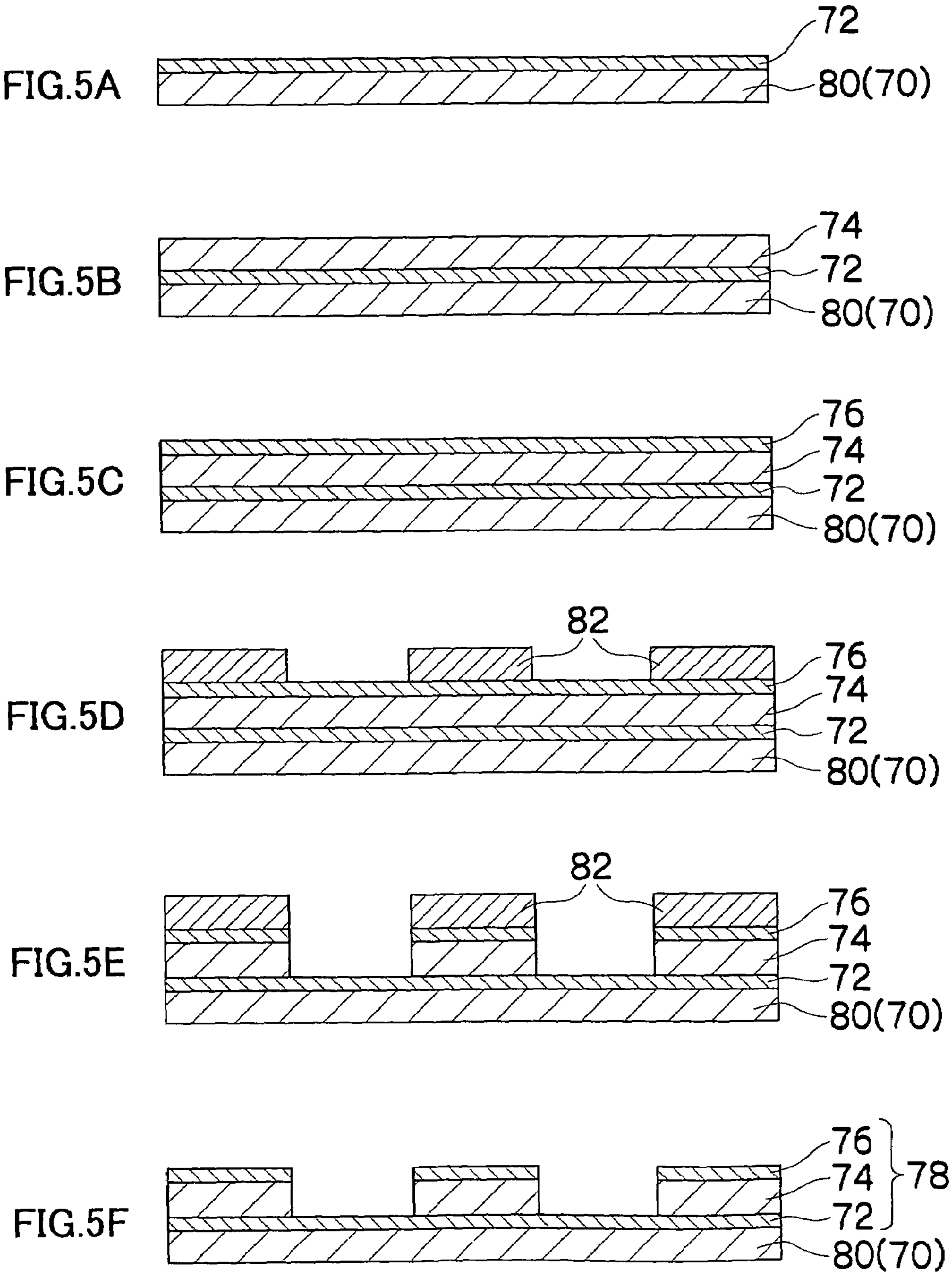
FIGS. 5A to 5F are illustrative diagrams showing steps of manufacturing a print head.

A method of manufacturing the print head 50 is described. FIGS. 5A to 5F are illustrative diagrams showing steps for forming the piezoelectric elements 78 on the diaphragm 70. Firstly, as shown in FIG. 5A, the common electrode 72 is formed by means of sputtering or screen printing onto the whole area of a surface of a substrate 80, which is to form the diaphragm 70. The substrate 80 used is made of ceramic, or the like. Next, as shown in FIG. 5B, an undivided piezoelectric body 74 is formed by means of screen printing onto the whole area of the surface of the common electrode 72. Moreover, as shown in FIG. 5C, an undivided individual electrode 76 is formed by means of sputtering or screen printing onto the whole surface of the piezoelectric body 74. The materials of the common electrode 72 and the individual electrode 76 are described hereinafter.

In the present embodiment, since the layers of the common electrode 72, the undivided piezoelectric body 74 and the undivided individual electrode 76 are formed over the whole surface of the substrate 80, then there is little variation of the layers in thickness and the thicknesses of the layers can be controlled readily, compared to a case where electrodes and piezoelectric bodies are formed independently by screen printing through a screen having a shape corresponding to the pressure chambers 52.

Next, resist (photosensitive resin) is formed on the whole surface of the undivided individual electrode 76, and then exposed and developed by a commonly known photolithography method, thereby forming a mask (resist) 82 having a prescribed pattern, as shown in FIG. 5D.

Figure 6:
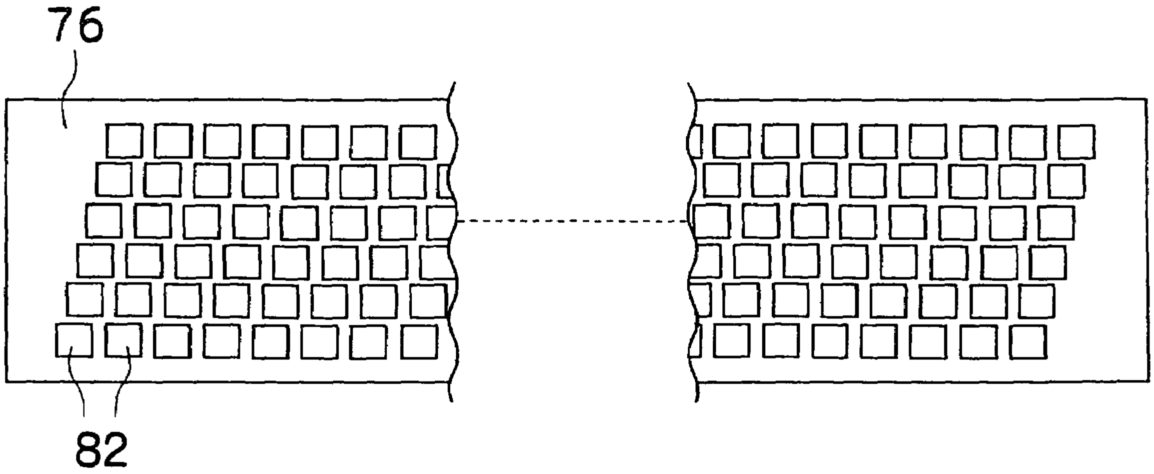
FIG. 6 is a plan diagram of a mask formed an individual electrode.

FIG. 6 is a plan diagram of the mask 82 formed on the undivided individual electrode 76. As shown in FIG. 6, the portions of mask 82 each have a substantially square planar shape, similarly to the divided piezoelectric bodies 74 and the divided individual electrodes 76 shown in FIG. 4, and are disposed two-dimensionally in a staggered matrix fashion on the individual electrode 76.

When the mask 82 has been formed on the undivided individual electrode 76 in this way, a sandblasting process is performed, which is a method for processing material by blowing abrasive particles of alumina ($Al_2O_3$), silicon carbide (SiC), or the like, in a high-pressure spray, for instance.

The material of the common electrode 72 is described here. In the present embodiment, the common electrode 72 forms the blast stopping layer in the sandblasting process. Therefore, a material that is resistant to blasting, such as a metal or alloy of high hardness and high elasticity, is used for the common electrode 72. On the other hand, a material of lower hardness than the material of the common electrode 72 is used for the undivided individual electrode 76.

Table 1 shows the hardness (Vickers hardness) of metals and their suitability for use in the blast stopping layer.

TABLE 1

| Metal | Vickers Hardness (Hv) | Suitability for Blast Stopping Layer |
|---|---|---|
| SUS304 | 150 | Yes |
| SUS430 | 150 | Yes |
| SUS310 | 185 | Yes |
| Gold | 26 | No |
| Silver | 26 | No |
| Copper | 46 | No |
| Titanium | 120 | Yes |
| Tungsten | 100 to 350 | Yes |
| Cobalt | 124 to 130 | Yes |

In Table 1, for example, SUS 304 has the Vickers hardness of 150 Hv, and the Young's modulus of 194 GPa, and therefore SUS304 is shown as being suitable for the blast stopping layer. On the other hand, gold has the Vickers hardness of 26 Hv and is therefore shown as being unsuitable for the blast stopping layer. The metals suitable for the blast stopping layer are SUS304, SUS430, SUS310, titanium (Ti), tungsten (W), and cobalt (Co), and each of these metals has the Vickers hardness of 100 Hv or above. In other words, desirably, a metal having the Vickers hardness of 100 Hv or above is selected as the material of the common electrode 72, and more desirably, the chosen metal has a high Young's modulus as well. The material for the common electrode 72 is not limited to pure metal, but can be selected from alloys, such as Fe—Ni alloy, Fe—Ni—Cr alloy, or the like. On the other hand, for the individual electrode 76, a material having the Vickers hardness of less than 100 Hv, such as gold, silver or copper, for example, is preferably selected.

Furthermore, desirably, the thickness of the common electrode 72 is 0.5 μm or above, taking account of the fact that it must act sufficiently as the blast stopping layer in the sandblasting process.

FIG. 5E shows a state after the sandblasting process. Since the common electrode 72 forms the blast stopping layer as described above, then the common electrode 72 has not been removed as shown in FIG. 5E, while the portions of the undivided individual electrode 76 and the undivided piezoelectric body 74 that are not covered by the masks 82 have been removed.

In this way, by using the common electrode 72 as the blast stopping layer, the substrate 80 to be the diaphragm 70 is not damaged by the abrasive particles blown during the sandblasting process, and therefore deterioration of the diaphragm 70 can be prevented.

Next, the mask 82 on the divided individual electrodes 76 is removed as shown in FIG. 5F, and the substrate 80, the common electrode 72, and the divided piezoelectric bodies 74 and the divided individual electrodes 76 are calcined together.

Finally, as shown in FIG. 3, the flow channel plate 62 and the nozzle plate 60 are bonded by means of adhesive, or the like, to overlap each other on the rear surface side of the diaphragm 70 (the surface of the diaphragm 70 reverse to the surface adjacent to the common electrode 72), and the print head 50 is thus manufactured. The flow channel plate 62 and the nozzle plate 60 can be formed by commonly known methods, for example, in which a plurality of plate members are bonded together, or the structure is formed in a silicon plate by means of etching in semiconductor technology, or the like.

In the present embodiment, the common electrode 72, the undivided piezoelectric body 74 and the undivided individual electrode 76 are formed over the whole surface of the diaphragm 70, and the sandblasting process is then carried out through the mask 82 having a prescribed pattern, while utilizing the common electrode 72 as the blast stopping surface, thereby dividing the undivided piezoelectric body 74 and the undivided individual electrode 76 into the piezoelectric bodies 74 and the individual electrodes 76 in a single operation. Therefore, compared to a case where the piezoelectric bodies and the electrodes are formed as individual bodies on the diaphragm 70 at positions corresponding to the pressure chambers, by means of different methods, it is possible to make the manufacturing process easier, and furthermore, it becomes possible to manufacture the print head 50 having the piezoelectric elements 78 of high dimensional accuracy, with little fluctuation in thickness or variation due to positional divergence between the piezoelectric bodies 74 and the individual electrodes 76.

Moreover, in the present embodiment, since the piezoelectric bodies 74 and the individual electrodes 76 on the diaphragm 70 are formed into individual bodies before calcining, then effects due to thermal contraction of the piezoelectric bodies 74 are distributed and warping of the diaphragm 70 is reduced, compared to a case where the undivided individual members are divided after calcining.

Further, in the present embodiment, since the common electrode 72 on the diaphragm 70 is used as the blast stopping surface, then the diaphragm 70 is not damaged by the abrasive particles blown during the sandblasting process, and hence deterioration of the diaphragm 70 can be prevented.

Furthermore, in the present embodiment, the divided piezoelectric bodies 74 and the divided individual electrodes 76 have a substantially square planar shape, and are disposed two-dimensionally in a staggered matrix fashion on the diaphragm 70 through the common electrode 72 formed over the whole surface of the diaphragm 70, so that the piezoelectric bodies 74 contract in a substantially isotropic fashion during calcining. Therefore, warping of the diaphragm 70 is reduced even further.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a liquid ejection head comprising: a plurality of nozzles which eject liquid; a plurality of pressure chambers which are connected to the nozzles, respectively; a diaphragm which forms wall faces of the pressure chambers; and piezoelectric elements which are disposed on the diaphragm at positions corresponding to the pressure chambers and each are formed of at least a piezoelectric material and electrodes overlapping each other, the method comprising the steps of:

forming a lower electrode on a whole surface of a substrate that is to form the diaphragm;

then forming piezoelectric material by screen printing onto a whole surface of the lower electrode;

then forming an upper electrode on a whole surface of the piezoelectric material;

then forming a mask having a prescribed pattern on the upper electrode;

then dividing the piezoelectric material and the upper electrode by performing a sandblasting process through the mask; and then calcining the substrate together with the divided piezoelectric material and upper electrode.

2. The method as defined in claim 1, wherein a hardness of the lower electrode is higher than a hardness of the upper electrode.

3. The method as defined in claim 2, wherein a material of the lower electrode is one of stainless steel, tungsten, cobalt, titanium, Fe—Ni alloy, and Fe—Ni—Cr alloy.

4. The method as defined in claim 1, wherein the divided piezoelectric material and upper electrode have a substantially square planar shape and are arranged two-dimensionally.

* * * * *